United States Patent
Zhang et al.

(10) Patent No.: US 7,863,963 B2
(45) Date of Patent: Jan. 4, 2011

(54) LEVEL SHIFTER FOR CHANGE OF BOTH HIGH AND LOW VOLTAGE

(75) Inventors: Shayan Zhang, Austin, TX (US); Andrew C. Russell, Austin, TX (US); Hector Sanchez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 37 days.

(21) Appl. No.: 12/358,859

(22) Filed: Jan. 23, 2009

(65) Prior Publication Data
US 2010/0188131 A1    Jul. 29, 2010

(51) Int. Cl.
*H03L 5/00* (2006.01)
(52) U.S. Cl. ...................................... 327/333
(58) Field of Classification Search ........................ None
See application file for complete search history.

(56) References Cited

U.S. PATENT DOCUMENTS

| | | | |
|---|---|---|---|
| 7,019,559 B2 * | 3/2006 | Kouzuma | 326/87 |
| 7,268,588 B2 | 9/2007 | Sanchez et al. | |
| 7,368,970 B2 | 5/2008 | Lin et al. | |
| 7,652,504 B2 * | 1/2010 | Campbell et al. | 326/68 |
| 2009/0174458 A1 * | 7/2009 | Campbell et al. | 327/333 |

OTHER PUBLICATIONS

Non-Published U.S. Appl. No. 12/183,739, filed Jul. 31, 2008 assigned to Freescale Semiconductor, Inc., with first named inventor Jeff Yang.

* cited by examiner

*Primary Examiner*—Lincoln Donovan
*Assistant Examiner*—Khareem E Almo
(74) *Attorney, Agent, or Firm*—James L. Clingan, Jr.; Daniel D. Hill

(57) ABSTRACT

A circuit comprises first and second inverters, first, second, third, and fourth transistors, and an enabling circuit. The first and second inverters each have an input terminal for receiving one of the first or second input signals, an output terminal, and first and second supply terminals. The first transistor is coupled to a first power supply terminal, to the output terminal of the second inverter, and to the first inverter. The second transistor is coupled to the first power supply terminal, to the output terminal of the first inverter, and to the first supply terminal of the second inverter. The third and fourth transistor are coupled to the second supply terminals of the first and second inverters, respectively, and each includes a control electrode and a second current electrode. The enabling circuit is for controlling the third and fourth transistors to reduce a leakage current in the circuit.

19 Claims, 3 Drawing Sheets

US 7,863,963 B2

LEVEL SHIFTER FOR CHANGE OF BOTH HIGH AND LOW VOLTAGE

BACKGROUND

1. Field

This disclosure relates generally to circuits and, more particularly, to level shifters in which both the high power supply voltage changes and the low power supply voltage changes.

2. Related Art

Level shifters play an important role in a variety of applications where power supply levels change. One way this has come up is in programming and erasing non-volatile memory cells. With the continuing reduction in power supply levels, the need for changing power supply levels with logic signals has become more prevalent. Integrated circuits commonly have more than one power supply level which has increased the need for level shifters. Most typically, the different voltage levels were positive voltages that were referenced to ground. There would be a voltage level VDD and another level VDL that was lower than VDD, but VDD and VDL were referenced to VSS which was normally ground. It is now become more common to not only vary the higher the voltage but also the lower voltage. Logic levels may be a logic low at a voltage VSL that is above VSS and a logic high at VDL that is below VDD. Different voltage levels for the both the logic high and the logic low make it more difficult to change from the level to another. One of the difficulties is in providing sufficient speed and another is in avoiding static power. When a level shifter is used to convert both the logic high and the logic low levels at the same time, a single stage delay may be preferred for high speed applications. After the level has been shifted, there should not be a steady state current path to ground. Reducing leakage current is becoming an increasingly important factor in extending battery life. It is thus desirable that any of transistors in the "non-conductive" state be strongly in that condition so as to reduce CMOS subthreshold leakage current. Another difficulty is in avoiding a multiple number of power supply rails used in a level shifter design when multiple logic levels are converted. Reducing the number of rails reduces routing congestion in the level shifter cell and at the boundary between two or more power supply voltage domains.

Accordingly, there is a need for a level shifter in which both the high power supply voltage changes and the low power supply voltage changes that overcomes or improves upon the problems described above or other problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a level shifter has a P channel configuration that is cross coupled whose primary function is to provide a logic level shift for the high voltage. One such example is shifting a logic high from VDL to a higher voltage level of VDD. Another portion of the circuit has mostly N channel transistors whose primary function is to provide the conversion from a voltage VSL down to VSS, which may be ground. This is better understood by reference to the following written description and the drawings.

Figure 1:
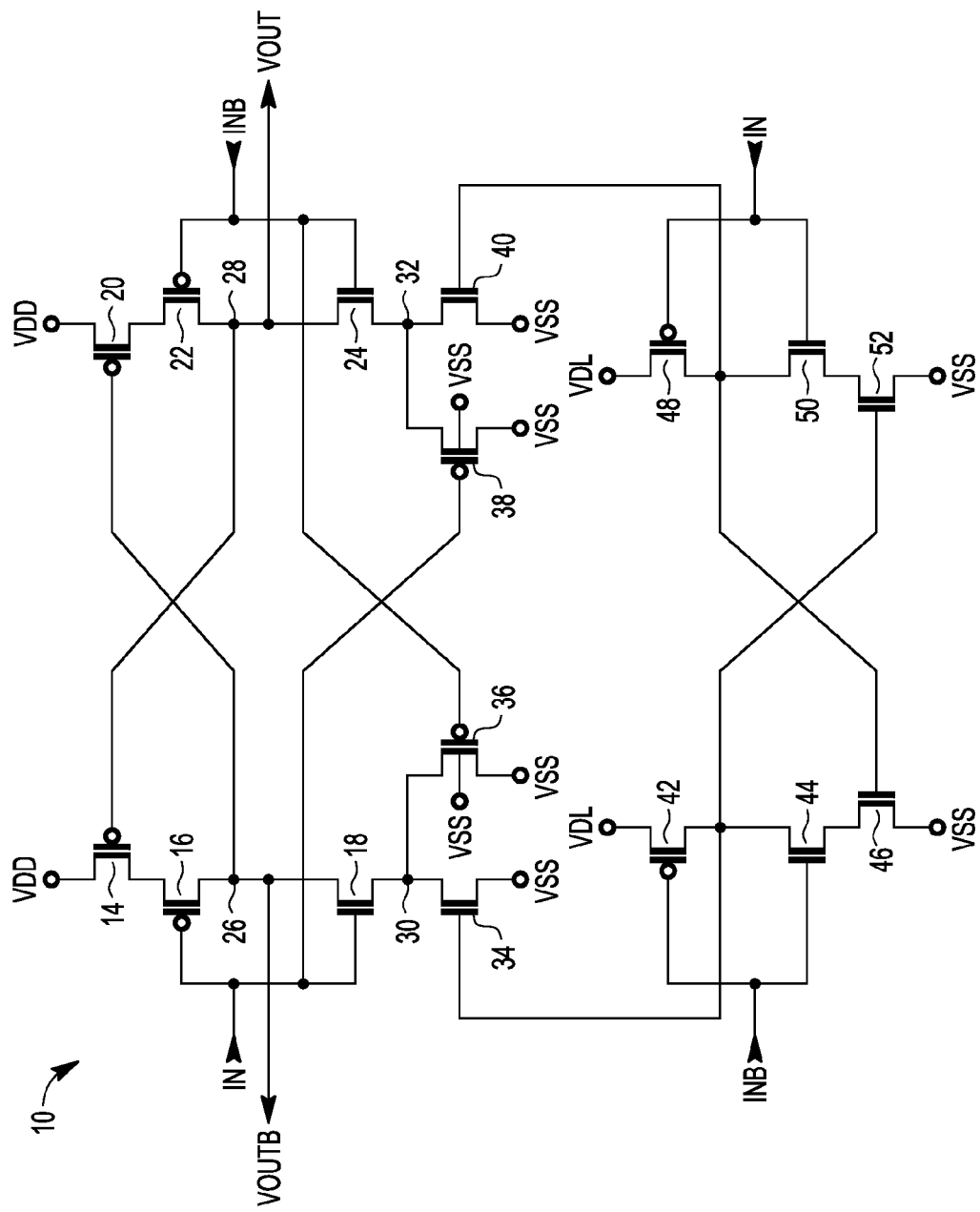
FIG. 1 is circuit diagram of a level shifter according to a first embodiment.

Shown in FIG. 1 is a level shifter 10 comprising a P channel transistor 14, a P channel transistor 16, an N channel transistor 18, a P channel transistor 20, a P channel transistor 22, an N channel transistor 24, an N channel transistor 34, a P channel transistor 36, a P channel transistor 38, an N channel transistor 40, P channel transistor 42, an N channel transistor 44, an N channel transistor 46, a P channel transistor 48, an N channel transistor 50, and an N channel transistor 52. Transistor 14 has a source connected to a power supply terminal VDD, a gate and a drain. Transistor 16 has a source connected to the drain of transistor 14, a gate for receiving a signal IN, and a source connected to a node 26. Transistor 18 has a drain connected to node 26, a gate for receiving signal IN, and a source connected to a node 30. Transistor 20 has a source connected to power supply terminal VDD, a gate and a drain. Transistor 22 has a source connected to the drain of transistor 20, a gate for receiving a signal INB, and a source connected to a node 28. Transistor 24 has a drain connected to node 28, a gate for receiving signal INB, and a source connected to a node 32. Transistor 34 has a drain connected to node 30, a source connected to a power supply terminal VSS, and a gate. Transistor 36 has a source connected to node 30, a drain connected to power supply terminal VSS, and a gate for receiving signal INB. Transistor 38 has a drain connected to node 32, a source connected to power supply terminal VSS, and a gate. Transistor 40 has a drain connected to node 32, a source connected to power supply terminal VSS, and a gate connected to the drains of transistors 48 and 50. Transistor 42 has a source connected to a power supply terminal VDL, a gate for receiving signal INB, and a drain connected to the gates of transistors 34 and 52. Transistor 44 has a drain connected to the drain of transistor 42, a gate for receiving signal INB, and a source. Transistor 46 has a drain connected to the source of transistor 44, a gate connected to the drains of transistors 48 and 50 and to the gate of transistor 40, and a source connected to power supply terminal VSS. Transistor 48 has a source connected to power supply terminal VDL, a gate for receiving signal IN, and a drain connected to the gates of transistors 40 and 46. Transistor 50 has a drain connected to the drain of transistor 48, a gate for receiving signal IN, and a source. Transistor 52 has a drain connected to the source of transistor 50, a gate connected to the drains of transistors 44 and 42 and to the gate of transistor 34, and a source connected to power supply terminal VSS. Transistor pair 16 and 18 may be considered an inverter. Similarly transistor pair 22 and 24 may be considered an inverter. Transistors 36 and 38 have their bodies, typically in a well or separate active region in a semiconductor-on-insulator (SOI) substrate, tied to VSS. Typically, bodies of P channel devices are connected to terminal VDD. With the bodies tied to VSS, it is possible to forward bias the PN junction between the drain and the body. The magnitude of the threshold voltage is also reduced. Both of these are useful in providing a faster voltage reduction for node 30 or node 32. Transistors 34, 36, 38, 40, 42, 44, 46, 48, 50, and 52 collectively form an enabling circuit to cut off leakage current paths in the circuit and to speed up initial transition of the level shifter 10 as described below.

Terminal VDD is for receiving a positive power supply voltage which may be 1.7 to 3.6 volts. Terminal VSS is for being coupled to a negative power supply voltage which may be ground. Terminal VDL is for receiving a power supply voltage, which may be 0.8 to 1.7 volts that is generally lower than the power supply voltage terminal VDD receives. Signal IN is a logic signal that is either at a logic high or a logic low. Signal INB is complementary to signal IN. The logic high is at or near a voltage VDL, which is the voltage received at terminal VDL. The logic low is at near voltage VSL which may be zero to 0.5 volt. Level shifter 10 functions to provide an output signal VOUT and a complementary output at the same logic states as signals IN and INB but at a higher voltage for the logic high and a lower voltage for the logic low. The logic high is at or near the voltage at terminal VDD and the logic low is at or near the voltage at terminal VSS. The voltage at terminal at VSS will be described as VSS. Although level shifting is not necessary when the logic high or low is the same as voltage VDD or VSS, respectively, the level shifter will still function to provide the desired logic states at the desired voltage levels.

In operation and using the example of signal IN being a logic high and signal INB being a logic low, transistor 48 is non-conductive and transistor 42 is conductive. With transistor 42 conductive, the gate of transistor 34 receives voltage VDL which causes transistor 34 to become conductive causing node 30 to be at VSS. Transistor 18 is conductive with its gate receiving voltage VDL and node 30 at VSS. Transistor 18 being conductive causes node 26 to be coupled to VSS through transistors 18 and 34 and thus node 26 at VSS which means that VOUTB is at VSS. With node 26 at VSS, transistor 20 is conductive so that its drain is then at voltage VDD which means that the drain of transistor 22 is at voltage VDD. With signal INB at voltage VSL, transistor 22 becomes conductive which results in node 28 being at voltage VDD which means that signal VOUT is at voltage VDD. Also occurring contemporaneously, transistor 36 responds to voltage VSL by becoming conductive so long as node 30 exceeds voltage VSL by the magnitude of the threshold voltage of transistor 36. The threshold voltage of transistor 36 is unlikely to have a threshold whose magnitude is greater than 0.2 volt. Thus transistor 36 will respond immediately to signal INB to reduce the voltage of node 30 so that transistor 18 can begin to reduce the voltage at node 26. Thus, transistor 36 speeds up the reduction of voltage on node 26 because there is a delay in causing transistor 34 from becoming conductive through transistor 42. Transistor 36, being directly responsive to signal INB is not delayed in reducing the voltage on node 30. After signals VOUT and VOUTB have reached voltage VDD and VSS, respectively, the possible current paths between terminal VDD and terminal VSS all blocked by at least one non-conductive transistor with its gate-source operating voltage |Vgs| biased at 0V. For example, transistor 14 is non-conductive due to its gate receiving VDD on its gate. Transistor 40 is non-conductive due to its gate being at VSS. Transistor 52 provides VSS on its drain due to transistor 42 being conductive and providing voltage VDL on the gate of transistor 52. Transistor 50 is conductive with its source at VSS and its gate at voltage VDL.

Operation is symmetrical for the inputs being reversed. In the case of signal IN switching to a logic low and signal INB switching to a logic high, Transistor 38 becomes conductive and begins drawing the voltage at node 32. Transistor 48 becomes conductive causing transistor 40 to become conductive which further reduces the voltage on node 40. After transistor 38 becomes non-conductive due to node 32 becoming too low, transistor 40 remains conductive and reducing node 32 to VSS. Transistor 24 becomes conductive with the reduction in voltage on node 32 and the gate of transistor 24 being at voltage VDL. With transistor 24 being conductive, node 28 becomes lower which causes transistor 14 to be conductive. While this is occurring and signal IN being a logic low, transistor 16 becomes conductive and with transistors 14 and 16 being conductive, node 26 rises until it reaches voltage VDD. Transistors 34 is non-conductive due to transistors 44 and 46 being conductive due to signal INB being at voltage VDL and transistor 48 being conductive due to signal IN being at voltage VSL. Transistors 36 and 38 provide a speed benefit but circuit 10 can be effective as a level shifter without them. With transistors 36 and 38 having their gate control terminals directly coupled to inputs IN and INB, the delay from inputs IN and INB to outputs VOUT and VOUTB is equivalent to only a delay time of a signal inverter. Thus level shifter 10 has a benefit of a very short delay time while simultaneously converting an input voltage logic high VDL to an output voltage logic high at VDD in which VDL is lower than VDD and an input voltage logic low at VSL to an output voltage logic low at VSS where VSL is greater than VSS. Transistors 44 and 50 also are beneficial but circuit 10 can be effective as a level shifter without them. Without transistors 44 and 50, transistors 46 and 52 would be connected the same except their drains would be connected to the drains of transistors 42 and 48. Transistors 44 and 50 reduce the loading on P channel transistors 42 and 48 so that the logic high output through one of transistors 42 or 48 will rise faster with transistors 44 and 50 present.

Figure 2:
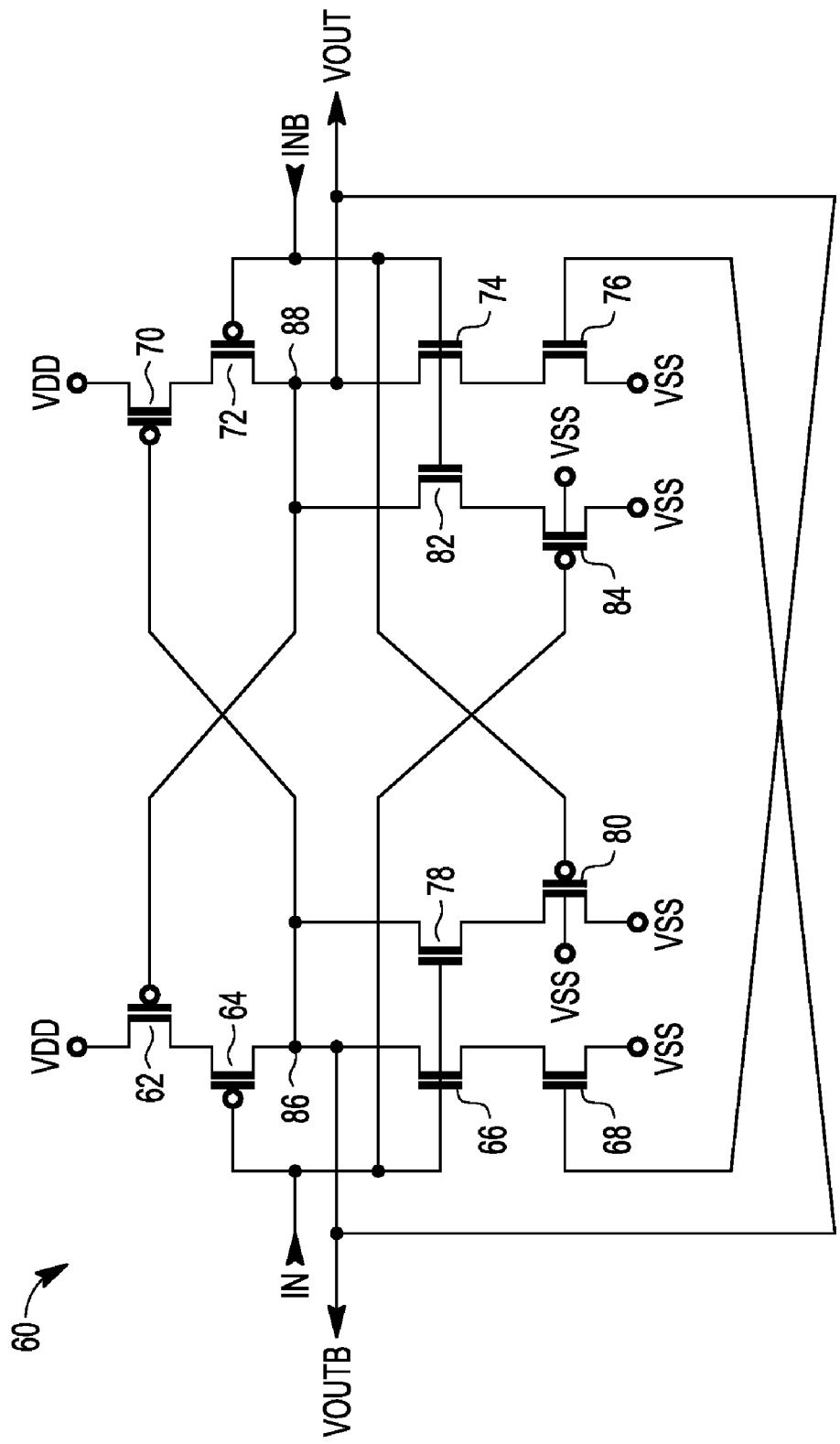
FIG. 2 is circuit diagram of a level shifter according to a second embodiment.

Shown in FIG. 2 is a level shifter 60 comprising a P channel transistor 62, a P channel transistor 64, an N channel transistor 66, a P channel transistor 70, a P channel transistor 72, an N channel transistor 74, an N channel transistor 68, an N channel transistor 78, a P channel transistor 80, an N channel transistor 82, a P channel transistor 84, and an N channel transistor 76. Transistor 62 has a source connected to a power supply terminal VDD, a gate and a drain. Transistor 64 has a source connected to the drain of transistor 62, a gate for receiving a signal IN, and a source connected to a node 86. Node 86 provides signal VOUTB. Transistor 66 has a drain connected to node 86, a gate for receiving signal IN, and a source. Transistor 68 has a drain connected to the source of transistor 66, a source connected to terminal VSS, and a gate connected to a node 88. Node 88 provides signal VOUT. Transistor 70 has a source connected to power supply terminal VDD, a gate and a drain. Transistor 72 has a source connected to the drain of transistor 70, a gate for receiving signal INB, and a source connected to node 88. Transistor 74 has a drain connected to node 88, a gate for receiving signal INB, and a source. Transistor pair 64 and 66 may be considered an inverter. Similarly transistor pair 72 and 74 may be considered an inverter. Transistor 76 has a drain connected to the source of transistor 74, a source connected to terminal VSS, and a gate connected to a node 86. Transistor 78 has a drain connected to node 86, a gate for receiving signal IN, and a source. Transistor 80 has a source connected to the source of transistor 78, a gate for receiving signal INB, and a drain connected to VSS. Transistor 82 has a drain connected to node 88, a gate for receiving signal INB, and a source. Transistor 84 has a source connected to the source of transistor 82, a gate for receiving signal IN, and a drain connected to VSS. Transistors 80 and 84 have their bodies, typically in a well or separate active region in a semiconductor-on-insulator (SOI) substrate, tied to VSS. Typically, bodies of P channel devices are connected to terminal VDD. Transistors 68, 76, 78, 80, 82 and 84 form an enabling circuit for level shifter 60. Transistors 68 and 76 are used to cut off leakage current paths in the circuit when the input logic low voltage level at IN or INB is higher than VSS. Transistors 78, 80, 82 and 84 are used to speed up initial transition of the level shifter 60 as described below.

In operation and assuming that signal IN is a logic high and signal INB is a logic low, transistor 78 will have a voltage of voltage VDL on its gate which will be sufficient for transistor 78 to couple node 86 to transistor 80. Transistor 80 receives voltage VSL on its gate which will cause it to be conductive and further the source of transistor 80 will be forward biased relative to its body. Thus the voltage on node 86 will be reduced. As node 86 has its voltage reduced, transistor 70 begins to be conductive. Transistor 72 has its gate at voltage VSL so it becomes conductive causing a rise in voltage on node 88, As node 88 rises in voltage, transistor 62 becomes less conductive making it easier for transistors 78 and 80 to further reduce the voltage on node 86 making transistor 70 more conductive. Also as node 88 rises in voltage transistor 68 becomes increasingly conductive. As node 86 reduces in voltage and transistor 68 becomes more conductive, transistor 66, with its gate at voltage VDL, becomes more conductive. These reductions and increases in conductivity continue until transistors 66 and 68 are sufficiently conductive and transistor 62 is sufficiently non-conductive that node 86 is at VSS. Once node 86 is at VSS, transistor is sufficiently non-conductive. At the same time, transistors 70 and 72 are sufficiently conductive that node 88 is pulled up to voltage VDD. Thus signal VOUT at node 88 is at the desired voltage of voltage VDD corresponding to a logic high and signal VOUTB at node 86 is at the desired VSS corresponding to a logic low.

Symmetrical operation occurs for the case of the input signals IN and INB switching to the logic low and logic high states respectively. A switch to signal IN being at voltage VSL causes transistors 66 and 78 to be less conductive and transistors 64 and 84 to more conductive while the switch to voltage VDL for signal INB causes transistors 74 and 82 to be more conductive and transistors 72 and 80 to be less conductive. In particular with transistors 82 and 84 being more conductive, node 88 begins reducing in voltage causing transistor 62 to become conductive. As transistor 62 becomes conductive and transistor 64 becoming more conductive, node 86 rises in voltage causing transistor 70 to become less conductive and transistor 76 to become more conductive. Transistors 70 and 72 becoming less conductive and transistors 74 and 76 becoming more conductive cause node 88 to lower in voltage further increasing the conductivity of transistor 62 and reducing the conductivity of transistor 68. This continues until node 86 is at voltage VDD and node 88 is at VSS so that VOUT is provided as a logic low at VSS and signal VOUTB is provided as a logic high at voltage VDD. Once node 88 is at voltage VSS, transistor 68 is completely turned off and so the leakage path from VDD to VSS through transistors 62, 64, 66 and 68 is cut off. Once node 86 is at voltage VDD, transistor 70 is completely turned off and so the leakage path to from VDD to VSS through transistors 70, 72, 74 and 76 is cut off. Transistors 78, 80, 82, and 84 ensure that nodes 86 and 88 move in the intended direction and with the feedback applied to transistors 62, 68, 70 and 76 outputs VOUT and VOUTB are ensured of reaching either voltage VDD or VSS.

Figure 3:
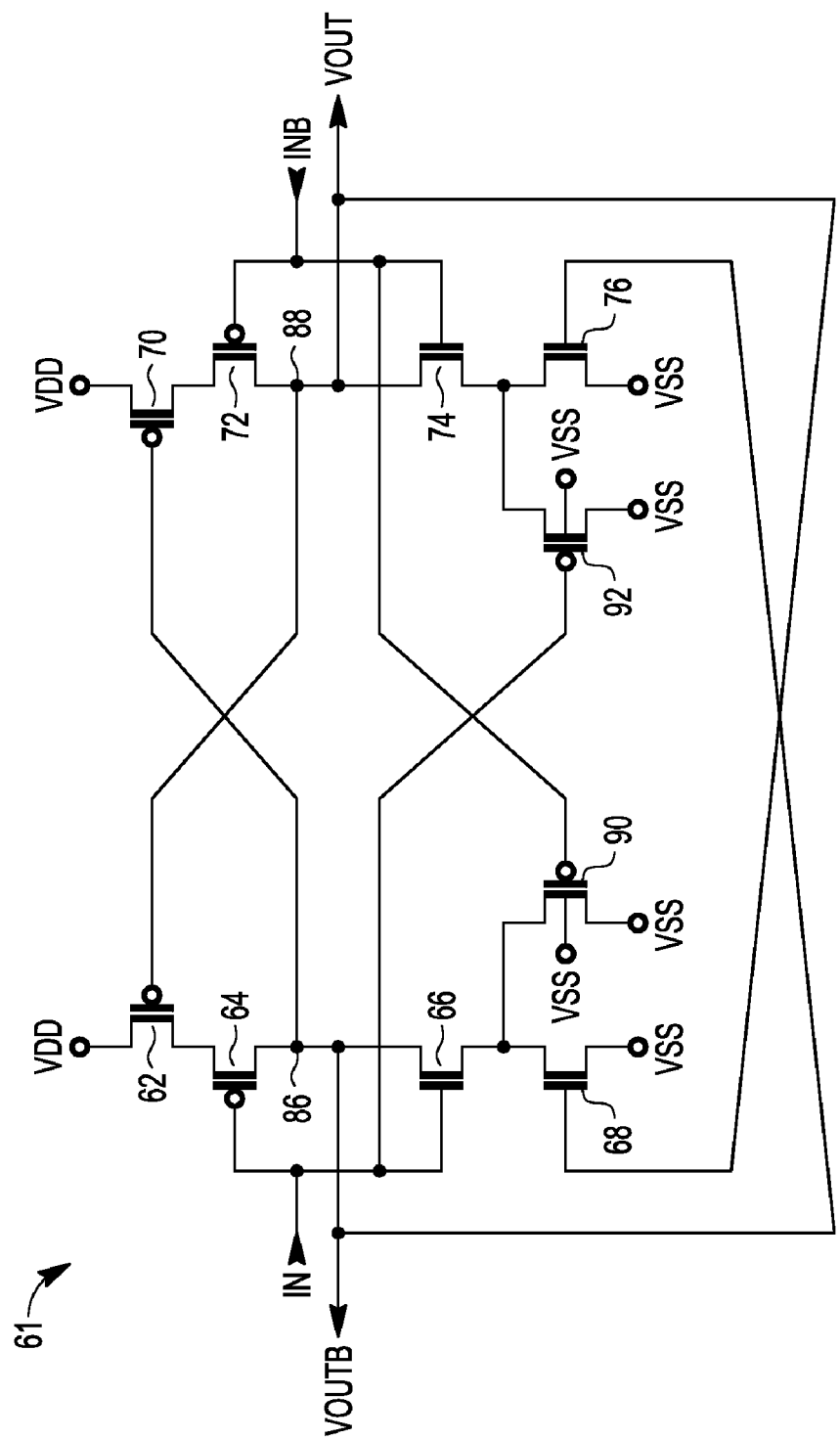
FIG. 3 is circuit diagram of a level shifter according to a third embodiment.

Shown in FIG. 3 is a level shifter 61 which is a variation on level shifter 60. Transistors 78, 80, 82, and 84 are replaced by P channel transistors 90 and 92. Transistor 90 has a source connected to the drain of transistor 66, a gate for receiving signal INB, and a drain connected to terminal VSS. Transistor 92 has a source connected to the drain of transistor 74, a gate for receiving signal IN, and a drain connected to terminal VSS. Transistors 66 and 78 in FIG. 2 had their drains and gates connected the same so that the connection of transistor 90 to transistor 66 is very analogous to the connection of transistor 80 to transistor 78. There is benefit of being able to independently control how transistor 80 controls node 86 from how transistor 66 interacts with transistor 68, but the configuration of FIG. 3 functions the same as that of FIG. 2 with two less transistors. When signal IN switches to a logic high, transistor 90, being a P channel, becomes more conductive with signal INB becoming a logic low. Transistor 66 becomes more conductive ensuring that node 86 reduces in voltage causing transistor 70 to become more conductive. The process continues so that node 88 increases in voltage and node 86 further decreases in voltage until the process is complete with signals VOUT and VOUTB being at voltage VDD and VSS respectively. In effect transistor 66 of FIG. 3 can be viewed as having a separate source that results in transistor 78 in FIG. 2 being connected to transistor 80.

Level shifter 60, 61 each uses only two power supply rails VDD and VSS to complete a voltage level converting function to provide an output signal VOUTNOUTB with a higher voltage at VDD for a logic high level than that of input signals IN and INB at VDL and with a lower voltage at VSS for a logic low than that of IN and INB at VSL which is above VSS. This reduces routing congestion inside the level shifter cells, at an upper integration level where the level shifter cells are used, and at the boundary between two or more power supply voltage domains on a SoC chip.

By now it should be appreciated that there has been provided a circuit having a first inverter, a second inverter, a first transistor, a second transistor, a third transistor, a fourth transistor, and an enabling circuit. The first inverter has an input terminal for receiving a first input signal, an output terminal, a first supply terminal, and a second supply terminal. The second inverter has an input terminal for receiving a second input signal, an output terminal, a first supply terminal, and a second supply terminal. The first transistor has a first current electrode coupled to a first power supply voltage terminal, a control electrode coupled to the output terminal of the second inverter, and a second current electrode coupled to the first supply terminal of the first inverter. The second transistor has a first current electrode coupled to the first power supply voltage terminal, a control electrode coupled to the output terminal of the first inverter, and a second current electrode coupled to the first supply terminal of the second inverter. The third transistor has a first current electrode coupled to the second supply terminal of the first inverter, a control electrode, and a second current electrode coupled to a second power supply voltage terminal. The fourth transistor has a first current electrode coupled to the second supply terminal of the second inverter, a control electrode, and a second current electrode coupled to the second power supply voltage terminal. The enabling circuit has a first output terminal coupled to the control electrode of the fourth transistor, a second output terminal coupled to the control electrode of the third transistor, the enabling circuit for controlling the third and fourth transistors to reduce a leakage current in the circuit. The circuit may be further characterized by the enabling circuit comprising a first connection for coupling the control electrode of the third transistor to the output terminal of the second inverter and a second connection for coupling the control electrode of the fourth transistor to the output terminal of the first inverter. The circuit may further comprise a fifth transistor having a first current electrode coupled to the output terminal of the first inverter, a control electrode coupled to receive the first input signal, and a second current electrode; a sixth transistor having a first current electrode coupled to the output terminal of the second inverter, a control electrode coupled to receive the second input signal, and a second current electrode; a seventh transistor having a first current electrode coupled to the second current electrode of the fifth transistor, a control electrode coupled to receive the second input signal, and a second current electrode coupled to the second power supply voltage terminal; and an eighth transistor having a first current electrode coupled to the second current electrode of the sixth transistor, a control electrode coupled to receive the first input signal, and a second current electrode coupled to the second power supply voltage terminal. The circuit may be further characterized by the seventh and eighth transistors both being P-channel transistors. The circuit may be further characterized by the seventh and eighth transistors each further comprising a substrate terminal, the substrate terminal coupled to the second power supply voltage terminal. The circuit may further comprise a fifth transistor having a first current electrode coupled to the first current electrode of the third transistor, a control electrode coupled to receive the second input signal, and a second current electrode and a substrate terminal both coupled to the second power supply voltage terminal; and. The circuit may be further characterized by a sixth transistor having a first current electrode coupled to the first current electrode of the fourth transistor, a control electrode coupled to receive the first input signal, and a second current electrode and a substrate terminal both coupled to the second power supply voltage terminal. The circuit may be further characterized by the fifth transistor and the sixth transistor both being P-channel transistors, wherein the fifth and sixth transistors each comprise a substrate terminal coupled to the second power supply voltage terminal. The circuit may be further characterized by the enabling circuit comprising a fifth transistor having a first current electrode coupled to a third power supply voltage terminal, a control electrode coupled to receive the second input signal, and a second current electrode coupled to the control electrode of the third transistor; a sixth transistor having a first current electrode coupled to the third power supply voltage terminal, a control electrode coupled to receive the first input signal, and a second current electrode coupled to the control electrode of the fourth transistor; a seventh transistor having a first current electrode coupled to the second current electrode of the fifth transistor, a control electrode coupled to the second current electrode of the sixth transistor, and a second current electrode coupled to the second power supply voltage terminal; and an eighth transistor having a first current electrode coupled to the second current electrode of the sixth transistor, a control electrode coupled to the second current electrode of the fifth transistor, and a second current electrode coupled to the second power supply voltage terminal. The circuit may further comprise a ninth transistor coupled between the fifth and seventh transistors and having a control electrode coupled to receive the second input signal; and a tenth transistor coupled between the sixth and eighth transistors and having a control electrode coupled to receive the first input signal. The circuit may be further characterized by the first power supply voltage terminal being coupled to receive a first power supply voltage having a first magnitude, the second power supply voltage terminal being coupled to receive a second power supply voltage having a second magnitude, and the third power supply voltage terminal being coupled to receive a third power supply voltage having a third magnitude, wherein the third magnitude is less than the first magnitude, and the second magnitude is less than the third magnitude.

Also described is a circuit having a first inverter, a second inverter, a first transistor, a second transistor, a third transistor, and a fourth transistor. The first inverter has an input terminal for receiving a first input signal, an output terminal, a first supply terminal, and a second supply terminal. The second inverter has an input terminal for receiving a second input signal, an output terminal, a first supply terminal, and a second supply terminal. The first transistor has a first current electrode coupled to a first power supply voltage terminal, a control electrode coupled to the output terminal of the second inverter, and a second current electrode coupled to the first supply terminal of the first inverter. The second transistor has a first current electrode coupled to the first power supply voltage terminal, a control electrode coupled to the output terminal of the first inverter, and a second current electrode coupled to the first supply terminal of the second inverter. The third transistor has a first current electrode coupled to the second supply terminal of the first inverter, a control electrode coupled to the output terminal of the second inverter, and a second current electrode coupled to a second power supply voltage terminal. The fourth transistor has a first current electrode coupled to the second supply terminal of the second inverter, a control electrode coupled to the output terminal of the first inverter, and a second current electrode coupled to the second power supply voltage terminal. The circuit may further comprise a fifth transistor having a first current electrode coupled to the first current electrode of the third transistor, a control electrode coupled to receive the second input signal, and a second current electrode coupled to the second power supply voltage terminal; and a sixth transistor having a first current electrode coupled to the first current electrode of the fourth transistor, a control electrode coupled to receive the first input signal, and a second current electrode coupled to the second power supply voltage terminal. The circuit may be further characterized by the fifth and sixth transistors being P-channel transistors, and wherein the fifth and sixth transistors each further comprise a substrate terminal coupled to the second power supply voltage terminal. The circuit may further comprise a seventh transistor having a first current electrode coupled to the output terminal of the first inverter, a control electrode coupled to receive the first input signal, and a second current electrode; an eighth transistor having a first current electrode coupled to the output terminal of the second inverter, a control electrode coupled to receive the second input signal, and a second current electrode; a ninth transistor having a first current electrode coupled to the second current electrode of the seventh transistor, a control electrode coupled to receive the second input signal, and a second current electrode coupled to the second power supply voltage terminal; and a tenth transistor having a first current electrode coupled to the second current electrode of the eighth transistor, a control electrode coupled to receive the first input signal, and a second current electrode coupled to the second power supply voltage terminal. The circuit may be further characterized by the ninth and tenth transistors being P-channel transistors, and wherein the ninth and tenth transistors each further comprise a substrate terminal coupled to the second power supply voltage terminal.

Described also is a circuit having a first inverter, a second inverter, a first transistor, a second transistor, a third transistor, a fourth transistor, a fifth transistor, a sixth transistor, a seventh transistor, and an eighth transistor. The first inverter has an input terminal for receiving a first input signal, an output terminal, a first supply terminal, and a second supply terminal. The second inverter has an input terminal for receiving a second input signal, an output terminal, a first supply terminal, and a second supply terminal. The first transistor has a first current electrode coupled to a first power supply voltage terminal, a control electrode coupled to the output terminal of the second inverter, and a second current electrode coupled to the first supply terminal of the first inverter. The second transistor has a first current electrode coupled to the first power supply voltage terminal, a control electrode coupled to the output terminal of the first inverter, and a second current electrode coupled to the first supply terminal of the second inverter. The third transistor has a first current electrode coupled to the second supply terminal of the first inverter, a control electrode, and a second current electrode coupled to a second power supply voltage terminal. The fourth transistor has a first current electrode coupled to the second supply terminal of the second inverter, a control electrode, and a second current electrode coupled to the second power supply voltage terminal. The fifth transistor has a first current electrode coupled to a third power supply voltage terminal, a control electrode coupled to receive the second input signal, and a second current electrode coupled to the control electrode of the third transistor. The sixth transistor has a first current electrode coupled to the third power supply voltage terminal, a control electrode coupled to receive the first input signal, and a second current electrode coupled to the control electrode of the fourth transistor. The seventh transistor has a first current electrode coupled to the second current electrode of the fifth transistor, a control electrode coupled to the second current electrode of the sixth transistor, and a second current electrode coupled to the second power supply voltage terminal. The eighth transistor has a first current electrode coupled to the second current electrode of the sixth transistor, a control electrode coupled to the second current electrode of the fifth transistor, and a second current electrode coupled to the second power supply voltage terminal. The circuit may further comprise a ninth transistor having a first current electrode coupled to the first current electrode of the third transistor, a control electrode coupled to the input terminal of the second inverter, and a second current electrode coupled to the second power supply voltage terminal; and a tenth transistor having a first current electrode coupled to the first current electrode of the fourth transistor, a control electrode coupled to the input terminal of the first inverter, and a second current coupled to the second power supply voltage terminal. The circuit may be further characterized by the ninth and tenth transistors being P-channel transistors, and wherein the ninth and tenth transistors each comprises a substrate terminal coupled to the second power supply voltage terminal. The circuit may be further characterized by the first power supply voltage terminal is coupled to receive a first power supply voltage having a first magnitude, the second power supply voltage terminal is coupled to receive a second power supply voltage having a second magnitude, and the third power supply voltage terminal is coupled to receive a third power supply voltage having a third magnitude, wherein the third magnitude is less than the first magnitude, and the second magnitude is less than the third magnitude. The circuit may further comprise a ninth transistor coupled between the fifth and seventh transistors and having a control electrode coupled to receive the second input signal; and a tenth transistor coupled between the sixth and eighth transistors and having a control electrode coupled to receive the first input signal.

Although the invention is described herein with reference to specific embodiments, various modifications and changes can be made without departing from the scope of the present invention as set forth in the claims below. For example, specific voltages are described as examples but other voltages may be used. Also outputs were described as being at voltage VDD or VSS, the actual output may vary based on loading. An output described at VSS mean at or near VSS. Similarly an output described as at voltage VDD means at or near the voltage at terminal VDD. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:
1. A circuit comprising:
 a first inverter having an input terminal for receiving a first input signal, an output terminal, a first supply terminal, and a second supply terminal;
 a second inverter having an input terminal for receiving a second input signal, an output terminal, a first supply terminal, and a second supply terminal;
 a first transistor having a first current electrode coupled to a first power supply voltage terminal, a control electrode coupled to the output terminal of the second inverter, and a second current electrode coupled to the first supply terminal of the first inverter;
 a second transistor having a first current electrode coupled to the first power supply voltage terminal, a control electrode coupled to the output terminal of the first inverter, and a second current electrode coupled to the first supply terminal of the second inverter;
 a third transistor having a first current electrode coupled to the second supply terminal of the first inverter, a control electrode, and a second current electrode coupled to a second power supply voltage terminal;
 a fourth transistor having a first current electrode coupled to the second supply terminal of the second inverter, a control electrode, and a second current electrode coupled to the second power supply voltage terminal; and
 an enabling circuit having a first output terminal coupled to the control electrode of the fourth transistor, a second output terminal coupled to the control electrode of the third transistor, the enabling circuit for controlling the third and fourth transistors to reduce a leakage current in the circuit, wherein the enabling circuit comprises:
  a first connection for coupling the control electrode of the third transistor to the output terminal of the second inverter; and
  a second connection for coupling the control electrode of the fourth transistor to the output terminal of the first inverter.
2. The circuit of claim 1, further comprising:
 a fifth transistor having a first current electrode coupled to the output terminal of the first inverter, a control electrode coupled to receive the first input signal, and a second current electrode;

a sixth transistor having a first current electrode coupled to the output terminal of the second inverter, a control electrode coupled to receive the second input signal, and a second current electrode;

a seventh transistor having a first current electrode coupled to the second current electrode of the fifth transistor, a control electrode coupled to receive the second input signal, and a second current electrode coupled to the second power supply voltage terminal; and an eighth transistor having a first current electrode coupled to the second current electrode of the sixth transistor, a control electrode coupled to receive the first input signal, and a second current electrode coupled to the second power supply voltage terminal.

3. The circuit of claim 2, wherein the seventh and eighth transistors are both P-channel transistors.

4. The circuit of claim 3, wherein the seventh and eighth transistors each further comprise a substrate terminal, the substrate terminal coupled to the second power supply voltage terminal.

5. The circuit of claim 1, further comprising:
a fifth transistor having a first current electrode coupled to the first current electrode of the third transistor, a control electrode coupled to receive the second input signal, and a second current electrode and a substrate terminal both coupled to the second power supply voltage terminal; and a sixth transistor having a first current electrode coupled to the first current electrode of the fourth transistor, a control electrode coupled to receive the first input signal, and a second current electrode and a substrate terminal both coupled to the second power supply voltage terminal.

6. The circuit of claim 5, wherein the fifth transistor and the sixth transistor are both P-channel transistors, wherein the fifth and sixth transistors each comprise a substrate terminal coupled to the second power supply voltage terminal.

7. A circuit comprising:
a first inverter having an input terminal for receiving a first input signal, an output terminal, a first supply terminal, and a second supply terminal;

a second inverter having an input terminal for receiving a second input signal, an output terminal, a first supply terminal, and a second supply terminal;

a first transistor having a first current electrode coupled to a first power supply voltage terminal, a control electrode coupled to the output terminal of the second inverter, and a second current electrode coupled to the first supply terminal of the first inverter;

a second transistor having a first current electrode coupled to the first power supply voltage terminal, a control electrode coupled to the output terminal of the first inverter, and a second current electrode coupled to the first supply terminal of the second inverter;

a third transistor having a first current electrode coupled to the second supply terminal of the first inverter, a control electrode, and a second current electrode coupled to a second power supply voltage terminal;

a fourth transistor having a first current electrode coupled to the second supply terminal of the second inverter, a control electrode, and a second current electrode coupled to the second power supply voltage terminal; and an enabling circuit having a first output terminal coupled to the control electrode of the fourth transistor, a second output terminal coupled to the control electrode of the third transistor, the enabling circuit for controlling the third and fourth transistors to reduce a leakage current in the circuit, wherein the enabling circuit comprises:

a fifth transistor having a first current electrode coupled to a third power supply voltage terminal, a control electrode coupled to receive the second input signal, and a second current electrode coupled to the control electrode of the third transistor;

a sixth transistor having a first current electrode coupled to the third power supply voltage terminal, a control electrode coupled to receive the first input signal, and a second current electrode coupled to the control electrode of the fourth transistor;

a seventh transistor having a first current electrode coupled to the second current electrode of the fifth transistor, a control electrode coupled to the second current electrode of the sixth transistor, and a second current electrode coupled to the second power supply voltage terminal; and an eighth transistor having a first current electrode coupled to the second current electrode of the sixth transistor, a control electrode coupled to the second current electrode of the fifth transistor, and a second current electrode coupled to the second power supply voltage terminal.

8. The circuit of claim 7, further comprising:
a ninth transistor coupled between the fifth and seventh transistors and having a control electrode coupled to receive the second input signal; and a tenth transistor coupled between the sixth and eighth transistors and having a control electrode coupled to receive the first input signal.

9. The circuit of claim 7, wherein the first power supply voltage terminal is coupled to receive a first power supply voltage having a first magnitude, the second power supply voltage terminal is coupled to receive a second power supply voltage having a second magnitude, and the third power supply voltage terminal is coupled to receive a third power supply voltage having a third magnitude, wherein the third magnitude is less than the first magnitude, and the second magnitude is less than the third magnitude.

10. A circuit comprising:
a first inverter having an input terminal for receiving a first input signal, an output terminal, a first supply terminal, and a second supply terminal;

a second inverter having an input terminal for receiving a second input signal, an output terminal, a first supply terminal, and a second supply terminal;

a first transistor having a first current electrode coupled to a first power supply voltage terminal, a control electrode coupled to the output terminal of the second inverter, and a second current electrode coupled to the first supply terminal of the first inverter;

a second transistor having a first current electrode coupled to the first power supply voltage terminal, a control electrode coupled to the output terminal of the first inverter, and a second current electrode coupled to the first supply terminal of the second inverter;

a third transistor having a first current electrode coupled to the second supply terminal of the first inverter, a control electrode coupled to the output terminal of the second inverter, and a second current electrode coupled to a second power supply voltage terminal; and a fourth transistor having a first current electrode coupled to the second supply terminal of the second inverter, a control electrode coupled to the output terminal of the first inverter, and a second current electrode coupled to the second power supply voltage terminal.

11. The circuit of claim 10, further comprising:
a fifth transistor having a first current electrode coupled to the first current electrode of the third transistor, a control electrode coupled to receive the second input signal, and a second current electrode coupled to the second power supply voltage terminal; and
a sixth transistor having a first current electrode coupled to the first current electrode of the fourth transistor, a control electrode coupled to receive the first input signal, and a second current electrode coupled to the second power supply voltage terminal.

12. The circuit of claim 11, wherein the fifth and sixth transistors are P-channel transistors, and wherein the fifth and sixth transistors each further comprise a substrate terminal coupled to the second power supply voltage terminal.

13. The circuit of claim 10, further comprising:
a seventh transistor having a first current electrode coupled to the output terminal of the first inverter, a control electrode coupled to receive the first input signal, and a second current electrode;
an eighth transistor having a first current electrode coupled to the output terminal of the second inverter, a control electrode coupled to receive the second input signal, and a second current electrode;
a ninth transistor having a first current electrode coupled to the second current electrode of the seventh transistor, a control electrode coupled to receive the second input signal, and a second current electrode coupled to the second power supply voltage terminal; and
a tenth transistor having a first current electrode coupled to the second current electrode of the eighth transistor, a control electrode coupled to receive the first input signal, and a second current electrode coupled to the second power supply voltage terminal.

14. The circuit of claim 13, wherein the ninth and tenth transistors are P-channel transistors, and wherein the ninth and tenth transistors each further comprise a substrate terminal coupled to the second power supply voltage terminal.

15. A circuit comprising:
a first inverter having an input terminal for receiving a first input signal, an output terminal, a first supply terminal, and a second supply terminal;
a second inverter having an input terminal for receiving a second input signal, an output terminal, a first supply terminal, and a second supply terminal;
a first transistor having a first current electrode coupled to a first power supply voltage terminal, a control electrode coupled to the output terminal of the second inverter, and a second current electrode coupled to the first supply terminal of the first inverter;
a second transistor having a first current electrode coupled to the first power supply voltage terminal, a control electrode coupled to the output terminal of the first inverter, and a second current electrode coupled to the first supply terminal of the second inverter;
a third transistor having a first current electrode coupled to the second supply terminal of the first inverter, a control electrode, and a second current electrode coupled to a second power supply voltage terminal;
a fourth transistor having a first current electrode coupled to the second supply terminal of the second inverter, a control electrode, and a second current electrode coupled to the second power supply voltage terminal;
a fifth transistor having a first current electrode coupled to a third power supply voltage terminal, a control electrode coupled to receive the second input signal, and a second current electrode coupled to the control electrode of the third transistor;
a sixth transistor having a first current electrode coupled to the third power supply voltage terminal, a control electrode coupled to receive the first input signal, and a second current electrode coupled to the control electrode of the fourth transistor;
a seventh transistor having a first current electrode coupled to the second current electrode of the fifth transistor, a control electrode coupled to the second current electrode of the sixth transistor, and a second current electrode coupled to the second power supply voltage terminal; and
an eighth transistor having a first current electrode coupled to the second current electrode of the sixth transistor, a control electrode coupled to the second current electrode of the fifth transistor, and a second current electrode coupled to the second power supply voltage terminal.

16. The circuit of claim 15, further comprising:
a ninth transistor having a first current electrode coupled to the first current electrode of the third transistor, a control electrode coupled to the input terminal of the second inverter, and a second current electrode coupled to the second power supply voltage terminal; and
a tenth transistor having a first current electrode coupled to the first current electrode of the fourth transistor, a control electrode coupled to the input terminal of the first inverter, and a second current coupled to the second power supply voltage terminal.

17. The circuit of claim 16, wherein the ninth and tenth transistors are P-channel transistors, and wherein the ninth and tenth transistors each comprises a substrate terminal coupled to the second power supply voltage terminal.

18. The circuit of claim 15, wherein the first power supply voltage terminal is coupled to receive a first power supply voltage having a first magnitude, the second power supply voltage terminal is coupled to receive a second power supply voltage having a second magnitude, and the third power supply voltage terminal is coupled to receive a third power supply voltage having a third magnitude, wherein the third magnitude is less than the first magnitude, and the second magnitude is less than the third magnitude.

19. The circuit of claim 15, further comprising:
a ninth transistor coupled between the fifth and seventh transistors and having a control electrode coupled to receive the second input signal; and
a tenth transistor coupled between the sixth and eighth transistors and having a control electrode coupled to receive the first input signal.

* * * * *